United States Patent
Verhaverbeke et al.

(10) Patent No.: US 6,495,099 B1
(45) Date of Patent: Dec. 17, 2002

(54) WET PROCESSING METHODS FOR THE MANUFACTURE OF ELECTRONIC COMPONENTS

(75) Inventors: Steven Verhaverbeke, Radnor, PA (US); Christopher F. McConnell, Berwyn, PA (US)

(73) Assignee: CFMT, Inc., Wilmington, DE (US)

( * ) Notice: Subject to any disclaimer, the term of this patent is extended or adjusted under 35 U.S.C. 154(b) by 0 days.

(21) Appl. No.: 09/209,101

(22) Filed: Dec. 10, 1998

Related U.S. Application Data

(60) Provisional application No. 60/069,043, filed on Dec. 10, 1997.

(51) Int. Cl.$^7$ .............................. A61L 9/00; C23G 1/00; C23G 1/02; B08B 7/00
(52) U.S. Cl. ................................ 422/28; 134/2; 134/3; 134/6
(58) Field of Search .................................. 134/2, 10, 11, 134/18, 56 R, 59, 61, 95, 572; 422/26, 27, 28

(56) References Cited

U.S. PATENT DOCUMENTS

| | | | | |
|---|---|---|---|---|
| 4,561,171 A | * | 12/1985 | Schlosser ..................... | 29/572 |
| 4,577,650 A | * | 3/1986 | McConnell .................. | 134/59 |
| 4,633,893 A | * | 1/1987 | McConnell et al. .......... | 134/95 |
| 4,738,272 A | * | 4/1988 | McConnell ................... | 134/59 |
| 4,740,249 A | * | 4/1988 | McConnell ................ | 134/25.4 |
| 4,778,532 A | * | 10/1988 | McConnell et al. ......... | 134/10 |
| 4,795,497 A | * | 1/1989 | McConnell et al. .......... | 134/18 |
| 4,856,544 A | * | 8/1989 | McConnell ................... | 134/95 |
| 4,868,996 A | | 9/1989 | Ohmori et al. ................ | 34/13 |
| 4,899,767 A | * | 2/1990 | McConnell et al. ...... | 134/56 R |
| 4,911,761 A | * | 3/1990 | McConnell et al. .......... | 134/11 |
| 4,917,123 A | * | 4/1990 | McConnell et al. .......... | 134/95 |
| 5,175,124 A | * | 12/1992 | Winebarger ................. | 437/180 |
| 5,308,400 A | * | 5/1994 | Chen ............................. | 134/2 |
| 5,423,944 A | | 6/1995 | Wong ....................... | 156/646.1 |
| 5,593,538 A | | 1/1997 | Davison et al. ........... | 156/637.1 |
| 5,681,397 A | * | 10/1997 | Li ................................. | 134/2 |
| 5,714,203 A | * | 2/1998 | Schellenberger et al. ...... | 134/3 |
| 5,725,753 A | * | 3/1998 | Harada et al. .............. | 205/746 |
| 5,727,578 A | * | 3/1998 | Matthews .................... | 134/61 |
| 5,733,434 A | * | 3/1998 | Harada et al. .............. | 205/746 |
| 5,827,784 A | * | 10/1998 | Loos .......................... | 438/750 |
| 5,858,106 A | * | 1/1999 | Ohmi et al. .................... | 134/1 |
| 6,132,522 A | * | 10/2000 | Verhaverbeke et al. ....... | 134/10 |

FOREIGN PATENT DOCUMENTS

| | | | |
|---|---|---|---|
| EP | 0385536 | * | 9/1990 |
| EP | 0 233 184 | * | 4/1992 |
| EP | 0 767 487 A1 | | 4/1997 |
| EP | 0 793 259 A2 A3 | | 9/1997 |

OTHER PUBLICATIONS

Burkman et al., "Aqueous Cleaning Processes", in Handbook of Semiconductor Wafer Cleaning Technology, Kern, W. (ed.), Noyes Publication, Parkridge, NJ, 1993, Chapter 3, 111–151.*

Horiki, H. et al., "Wet etch Cleaning", in Ultraclean Technology handbook, Ohmi, T. (ed.), Marcel Dekker, 1991, vol. 1, Ch. 3, 805–819.*

Kern, W., "Overview and Evolution of Semiconductor Wafer contamination and Cleaning Technology", in Handbook of Semiconductor Wafer Cleaning Technology, Kern, W. (ed.), Noyes Publication, Parkridge, NJ, 1993, Chapter1, 3–67.*

Schadel, J., "Device Failure Mechanisms in Integrated Circuits", Solid State Devises 1983: Inst. Phys. Conf. Ser. No. 69, Institute of Physics, London, 1984, 105–120.*

Leenaars, A.F.M. et al., "Marangoni Drying: A new extremely clean drying process", *Langmuir*, 1990, 6, 1701–1703.

Burkman et al., "Aqueous Cleaning Processes", in *Handbook of Semiconductor Wafer Cleaning Technology*, Kern, W. (ed.), Noyes Publication, Parkridge, NJ, 1993, Chapter 3, 111–151.

Horiki, H. et al., "Wet Etch Cleaning", in *Ultraclean Technology Handbook*, Ohmi, T. (ed.), Marcel Dekker, 1991, vol. 1, Ch. 3, 805–819.

Schadel, J., "Device Failure Mechanisms in Integrated Circuits", *Solid State Devices 1983: Inst. Phys. Conf. Ser. No. 69*, Institute of Physics, London, 1984, 105–120

* cited by examiner

Primary Examiner—Robert J. Warden, Sr.
Assistant Examiner—Imad Soubra
(74) Attorney, Agent, or Firm—Woodcock Washburn LLP

(57) ABSTRACT

The present invention is directed to wet processing methods for the manufacture of electronic component precursors, such as semiconductor wafers used in integrated circuits. The electronic component precursors are placed in a reaction chamber and contacted with at least one reactive chemical process fluid for a selected period of time. The reactive process fluid can be, for example, hydrofluoric acid. The electronic component precursors are then exposed directly to a drying fluid, with no intervening rinsing fluid, for a selected period of time. The drying fluid can be a vapor.

42 Claims, No Drawings

WET PROCESSING METHODS FOR THE MANUFACTURE OF ELECTRONIC COMPONENTS

CROSS-REFERENCE TO RELATED APPLICATIONS

This Application claims the benefit under 35 U.S.C. §119(e) of U.S. provisional application Ser. No. 60/069,043 filed Dec. 10, 1997.

FIELD OF THE INVENTION

The present invention is directed to wet processing methods for the manufacture of electronic components and electronic component precursors, such as semiconductor wafers used in integrated circuits. More specifically, this invention relates to methods of, for example, cleaning, stripping, and etching of electronic component precursors using dry displacement technology in conjunction with wet chemical processing techniques.

BACKGROUND OF THE INVENTION

Wet processing is used extensively during the manufacture of integrated circuits, which typically comprise electronic component precursors such as semiconductor wafers, flat panels, and other electronic component precursors. Generally, the electronic component precursors are placed in a bath or a vessel and then contacted with a series of reactive chemical process fluids and rinsing fluids. The process fluids may be used, without limitation, for etching, photoresist stripping, and prediffusion cleaning and other cleaning steps of the electronic component precursors. See, e.g., U.S. Pat. Nos. 4,577,650; 4,740,249; 4,738,272; 4,856,544; 4,633,893; 4,775,532; 4,917,123; and EPO 0,233,184, assigned to a common assignee, and Burkman et al., Wet Chemical Processes-Aqueous Cleaning Processes, pg 111–151 in Handbook of Semiconductor Wafer Cleaning Technology (edited by Werner Kern, Published by Noyes Publication Parkridge, N.J. 1993), the disclosures of which are herein incorporated by reference in their entirety.

In a typical wet processing technique, electronic component precursors are exposed to reactive chemical process fluids to either remove (i.e., cleaning) contamination on the electronic component precursors or to etch some part of the surface. After this cleaning or etching is performed, the chemical will adhere to the surface or surfaces of the electronic component precursors. The adhered chemical must then be removed before treating the electronic component precursors with the next reactive chemical process fluid so that the chemical residue does not contaminate the next reactive chemical process.

Therefore, in current wet processing techniques, after each chemical treatment step, the electronic component precursors are rinsed with DI water to remove the chemicals from the surface or surfaces of the electronic component precursors, whether the chemical treatment is done in a bath, full flow vessel, or using other wet bench techniques. Sometimes a trace chemical may be added to the rinse water to give the rinsing fluid a certain property that may be beneficial. Even if the rinsing fluid (i.e., water) is modified with a trace chemical, its function is not changed. There is a clear distinction between chemicals that are used to perform, for example, the cleaning or etching action of the electronic component precursors and the rinsing fluid, which is intended to remove the chemicals from the surfaces of the electronic component precursors (even though the water may not be pure water but may have certain chemicals added to it).

In conventional techniques, a rinse with deionized (DI) water is always performed after the last chemical treatment step and before the wafers are dried, whether the chemical treatment is done in a bath, full flow vessel, or using other wet bench techniques. Although a DI rinse removes the given chemical from the surface of the electronic component precursors after the chemical has performed its function (e.g., cleaning or etching), this rinsing step imposes several limitations on the manufacture of semiconductor components. For example, it is standard in the industry to rinse the electronic component precursors between chemical treatment steps with DI water until the level of dissolved chemicals is about 10 p.p.b. (i.e., 4–16 Mohm-cm). This requires extensive rinsing.

Because DI water tends to be very expensive, rinsing substantially increases the costs of manufacturing electronic component precursors. DI rinsing also takes a long time, sometimes consuming as much as 60% of the total wet processing time, therefore decreasing throughput of the electronic component precursors.

The rinse with DI water can also compromise the integrity of the wet processing techniques by causing precipitation of residual material or by causing the formation of undesirable oxide, silica, and/or metal precipitates. A rinsing fluid, even when it is pure DI water is sometimes reactive with semiconductor materials such as silicon and can oxidize some silicon atoms on the surface of the semiconductor material.

In addition to rinsing electronic component precursors after treatment with reactive chemical process fluids, the electronic component precursors normally need to be dried. This can be a particularly challenging process because it is important that no contamination be created during the drying process. Evaporation is undesirable since it often leads to spotting or streaking. Even the evaporation of ultra high purity water can lead to problems because such water is very aggressive to the water surface and will dissolve traces of silicon and silicon dioxide during even short periods of water contact. Subsequent evaporation will leave residues of the solute material on the wafer surface. Contamination and other causes of semiconductor failure are discussed, for example, in J. Schadel, "Device Failure Mechanisms In Integrated Circuits," Solid State Devices 1983 Conf. Ser. No. 69 (Institute of Physics, London 1984) 105–120.

Conventionally, semiconductors are dried through centrifugal force in a spin-rinser-drier. Because these devices rely on centrifugal force to "throw" water off the wafer surfaces, their use results in several problems. First, there are mechanical stresses placed on the wafers which may result in wafer breakage, particularly with larger wafer sizes. Second, because there are many moving parts inside a spin-rinser-drier, contamination control becomes a difficult problem. Third, since the wafers conventionally travel at high velocity through dry nitrogen, static electric charges develop on the wafer surfaces. Since oppositely charged airborne particles are quickly drawn to the wafer surfaces when the spin-rinser-drier is opened, particular contamination results. Fourth, it is difficult to avoid evaporation of water from the surfaces of the wafers during the spin process with the attendant disadvantages discussed above.

More recently, methods and apparatus have been developed for steam or chemical drying of wafers, including the method and apparatus disclosed in U.S. Pat. No. 4,778,532. Chemical drying generally comprises two steps. First, the rinsing fluid, preferably water is driven off the wafers and replaced by a nonaqueous drying fluid. Second, the nonaqueous drying fluid is evaporated using a predried gas, preferably an inert gas such as nitrogen at a low flow velocity.

Another chemical drying process currently used in Japan consists of sequentially immersing the wafer carrying vessel in tanks of deionized water, followed by suspending the wafers above a tank of boiling isopropanol. The wafer-carrying vessel is then slowly withdrawn from the isopropanol vapor to pull the water droplets off the wafer surfaces.

One of the most important features for an effective wafer drying technology is that the wafers produced be ultraclean (i.e., with minimum particle contamination and minimum chemical residue).

Thus, there is the need in the art for a simple and efficient method that permits the safe chemical treatment of electronic component precursors, while at the same time eliminating the problems and costs associated with DI rinsing after chemical treatment steps and the problems associated with drying electronic component precursors using conventional techniques. The present invention addresses these as well as other needs.

SUMMARY OF THE INVENTION

The invention presents, inter alia, wet processing methods useful in the manufacture of electronic component precursors, such as semiconductor wafers and flat panels, used in integrated circuits. These novel methods can be used for the cleaning, stripping, and/or etching of electronic component precursors, such as semiconductor wafers.

In conventional wet processing techniques, a reactive chemical process fluid is removed from the surface or surfaces of a electronic component precursors with a rinsing fluid, such as DI water. It has been discovered that a reactive chemical process fluid can be displaced from the surface of a semiconductor wafer by using a drying fluid, such as isopropyl alcohol instead of a rinsing fluid, thereby eliminating the final DI rinse of electronic component precursors. It is also contemplated that a drying fluid may be used between chemical treatment steps thereby eliminating or minimizing the need for DI rinses between chemical treatment steps. By eliminating the final DI rinse and minimizing the use of DI water between chemical treatment steps, the problems that may be associated with its use, such as precipitation of silica, metal, and/or oxide precipitates, can be minimized, if not avoided.

It has also been discovered that the drying fluid serves the additional function of drying the electronic component precursors, thus, eliminating the need for an additional drying step as in conventional wet processing techniques.

In particular, the invention is directed to a method for the manufacture of electronic component precursors comprising: placing the electronic component precursors in a reaction chamber; contacting the surfaces of said electronic component precursors with at least one reactive chemical process fluid for a selected period of time; and exposing the electronic component precursors to a drying fluid for a selected period, after the electronic component precursors have been exposed to the final reactive chemical process fluid.

In one aspect of the invention, the electronic component precursors are maintained in a single reaction chamber during the entire chemical treatment process. In this aspect of the invention, the electronic component precursors are placed in a reaction chamber and the surfaces of the electronic component precursors are contacted with one or more reactive chemical process fluids for a selected period of time without removing the electronic component precursors from the reaction chamber. If more than one reactive chemical process fluid is to be used for treating the electronic component precursors, the process fluids may be introduced sequentially into the reaction chamber such that one process fluid directly displaces the previous process fluid from the surface or surfaces of the electronic component precursors, thereby eliminating the step of a DI rinse, or by draining the chamber of one reactive chemical process fluid before exposing the electronic component precursors to another reactive chemical process fluid. It is also contemplated that a DI rinse may be used between chemical treatment steps. The DI rinse may directly displace the reactive chemical from the surface or surfaces of the electronic component precursors or the chamber may be drained before the DI rinse is introduced into the chamber. It is also contemplated that a drying fluid may be used between chemical treatment steps in place of a DI rinse. In such instances, the drying fluid would be introduced into the reaction chamber such that it would directly displace the reactive chemical process fluid from the surface or surfaces of the electronic component precursors.

In another aspect of the invention, the electronic component precursors are moved from one reaction chamber to another, wherein each reaction chamber contains a different reactive chemical process fluid. According to this aspect of the invention, after treating the electronic component precursors with one reactive chemical process fluid, the electronic component precursors are immediately immersed into the next reactive chemical process fluid contained in another reaction chamber without rinsing the electronic component precursors with a rinsing fluid to remove the previous reactive chemical process fluid from the surfaces of the electronic component precursors. It is contemplated, however, that the electronic component precursors can be immersed in a chamber containing a rinsing fluid in between chemical treatment steps. It is further contemplated that the electronic component precursors can be immersed in a chamber containing a drying fluid in between chemical treatment steps.

Regardless of the reaction chamber used for treating the electronic component precursors, in a preferred embodiment, following exposure of the electronic component precursors to the last reactive chemical process fluid, a drying fluid is supplied to the reaction chamber such that the it displaces the last reactive chemical process fluid from the surface or surfaces of the electronic component precursors preferably at such a rate that substantially no liquid droplets are left on the surfaces after replacement of the reactive chemical process fluid with the drying fluid. It is also contemplated that the electronic component precursors may be exposed to a drying fluid between chemical treatment steps, thereby eliminating the step of a DI rinse between each chemical treatment step.

The use of a drying fluid in place of a DI rinse to remove reactive chemical process fluids from the surface or surfaces offers the advantages of higher output of electronic component precursors. By eliminating the DI rinse and a separate drying step at the end of the wet processing technique, the methods of the invention result in a significant costs savings because DI water is very expensive. These are great benefits to the semiconductor manufacturing industry. The method of the invention offers improved safety because the reactive chemicals such as HF are removed from the ends of electronic component precursors, and prevents operators from being exposed to such hazardous chemicals. These methods also result in improved process performance of electronic component precursors (i.e., wafers or panels are cleaner).

DETAILED DESCRIPTION OF THE INVENTION

The terminology "reactive process fluid," "reactive chemical process fluid," "processing fluid," "chemical fluid," "active chemical," or "reactive chemical process fluid," as used herein, refers to the reactive fluids that electronic component precursors are exposed to during their manufacture and perform some action on the surface electronic component precursors, as distinguished from a rinsing fluid such as DI water. These terms may be used interchangeably. When used in connection with the terminology "process fluid," "reactive" or "active" means, without limitation, a process fluid that has some activity in removing contamination such as particulate, metallic impurities, or organic from the surface of the electronic component precursor, or has some activity in etching the surface of the electronic component precursor, or active in growing an oxide layer on the surface of the electronic component precursor. An example of such a reactive chemical process fluid is an aqueous solution of hydrofluoric acid (HF), which may have a concentration greater than 1000:1 (H20:HF).

The terminology "chemical treatment step," as used herein, refers to exposing the electronic component precursors to a reactive chemical process fluid.

The terminology "rinsing fluid" or "rinse fluid," as used herein, refers to DI water or some other fluid that is used to rinse the electronic component precursors after exposure to a reactive chemical process fluid, as compared to treating them with a chemical. A rinse fluid may be DI water or a very dilute aqueous solution of a chemical (e.g., hydrochloric acid) to prevent, for example, metallic deposition on the surface of the electronic component precursors (using very dilute solution of hydrochloric acid). Ozone is another additive used during rinsing. The chemical concentration in such rinsing fluids is minute; generally, the concentration is not greater than about 100 ppm. The primary goal of the rinsing fluid is to remove chemicals or reaction products from the surface of the electronic component precursors, and not to perform some "reactive" process.

The terminology "drying fluid," as used herein includes drying vapors. A drying fluid or vapor facilitates the removal of liquid from a surface.

The terminology "reaction chamber," as used herein, refers to vessels, either vessels that are open to the environment or enclosed vessels wherein the vessel has a controlled atmosphere and is not exposed to the environment; full flow vessels; baths; wet benches; and other reservoirs suitable for wet processing methodologies.

As used herein, the terminology "full flow vessel," refers to a vessel that is closed to the environment and is employed in a "full flow method." As used herein, the terminology "electronic component precursors" includes, without limitation, semiconductor wafers, flat panels, and other components used in the manufacture of electronic components (i.e., integrate circuits). This terminology also includes "pre-epi wafers," which are wafers which will have epitaxial silicon grown on them during a further wet processing technique.

The methods of the invention are generally applicable to any wet processing equipment including, without limitation, full flow methods, wet benches (baths), and spray cleaning systems. See, e.g., Chapter 1: Overview and Evolution of Semiconductor Wafer Contamination and Cleaning Technology by Werner Kern and Chapter 3: Aqueous Cleaning Processes by Don C. Burkman, Donald Deal, Donald C. Grant, and Charlie A. Peterson in Handbook of Semiconductor Wafer Cleaning Technology (edited by Werner Kern, Published by Noyes Publication Parkridge, N.J. 1993), and Wet Etch Cleaning by Hiroyuki Horiki and Takao Nakazawa in Ultraclean Technology Handbook, Volume 1, (edited by Tadahiro Ohmi published by Marcel Dekker), the disclosures of which are herein incorporated by reference in their entirety.

Semiconductor fabrication is described generally, for example, in P. Gise et al., Semiconductor and Integrated Circuit Fabrication Techniques (Reston Publishing Co. Reston, Va. 1979), the disclosures of which are herein incorporated by reference in their entirety.

The reactive chemical process fluids suitable for practicing the invention include, without limitation, aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof. The particular process fluids used, the equipment used, the exposure time, and the experimental conditions (i.e., temperature, concentration, and flow of the process fluid) will vary depending on the particular purpose of the particular wet processing methodology.

Drying fluids suitable for practicing the invention include, without limitation, pure or diluted isopropanol. Preferably, the drying fluid should be substantially pure and either saturated and/or preferably superheated, and the surfaces should be heated to a temperature near to but preferably below that of the drying fluid prior to contact. While this may result in some condensation of drying fluid on the surfaces, and too much condensation should be avoided, it has been found that preheating to above the temperature of the drying fluid yields poorer results. The preferred drying fluid is isopropanol, more preferably pure isopropanol. Other drying fluids known to those skilled in the art may be used without departing from the spirt of the invention. See, e.g., U.S. Pat. Nos. 4,778,532 and 4,911,761, the disclosures of which are herein incorporated by reference in their entirety. The temperature and pressure of the drying fluid must be appropriately controlled. The drying fluid may be diluted with carriers gases known to those skilled in the art, with nitrogen being preferred. In certain embodiments of the step of drying the electronic component precursors using a drying vapor, a liquid layer of the drying fluid may be formed which displaces a rinsing or reactive chemical process fluid.

The methods of the invention may be used for etching the surfaces of semiconductor wafers to remove any unwanted oxide layer from the silicon surface. The present invention may also be used in controlled oxide etching. Typical etchants for silicon dioxide include, without limitation, hydrofluoric acid, or ammonium fluoride buffered hydrofluoric acid.

As stated above, the electronic component precursors to be treated in accordance with the methods of the invention may be treated in a variety of reaction chambers, such as baths, vessels, or other wet bench techniques without departing from the spirit of the invention.

A typical processing area for treating electronic component precursors will have storage tanks for chemical reagents, such as ammonium hydroxide (NH40H) or hydroflouric acid (HF). These reagents are typically stored in their concentrated form, which is: hydrogen peroxide (H202) (31%), NH40H (28%), hydrochloric acid (HCl) (37%), HF (49%), and sulfuric acid (H2S04) (98%) (percentages represent aqueous solutions). This processing area will also include a storage tank for any drying fluids or vapors and/or carrier gases that may be used in performing the methods of the invention (i.e., isopropanol or nitrogen). The reaction chamber where the electronic component precursors are being treated is in fluid communication with the chemical storage tanks. A control valve and pump may be used as processing equipment between the storage tanks and the reaction chamber. In such a way, a processing control system, such as a personal computer, can be used as a means to monitor reaction conditions (i.e., flow rates, mix rates, exposure times, and temperature).

It is preferred, that the electronic component precursors treated in accordance with the methods of the invention, be housed in an enclosed vessel (i.e., a "full flow" vessel), preferably such as those disclosed in U.S. Pat. Nos. 4,911,761; 4,633,893; 4,917,123; 4,738,272; and 4,577,650, the disclosures of which are herein incorporated by reference in their entirety. Such "full flow methods" are preferred because they result in a more uniform treatment of the electronic component precursors and are more efficient. In addition, often the chemicals utilized in the chemical treatment of electronic component precursors are quite dangerous in that they may be strong acids, alkalis, or volatile solvents. Full flow vessels minimize the hazards associated with such process fluids by avoiding atmospheric contamination and personnel exposure to the chemicals, and by making handling of the chemicals safer. Although vessels as those disclosed in the above-identified U.S. patents are preferred, any such vessels known to persons skilled in the art may be used without departing from the spirit of the invention.

Generally, in practicing a preferred embodiment of the invention, the electronic component precursors will be placed in a full flow vessel and the reactive chemical process fluids will be introduced into the vessel through a valve or injection port. The electronic component precursors may be treated with any number of reactive chemical process fluids. In between chemical treatment steps, the electronic component precursors may be exposed to a DI rinse or a drying fluid, or one reactive chemical process fluid may displace the previous reactive chemical process fluid. After the electronic component precursors have been treated with the last reactive chemical process fluid, the process fluid is displaced from the surface of the electronic component precursor using a drying fluid instead of a rinsing fluid. The drying fluid is introduced into the reaction chamber from the top of the vessel as the reactive chemical process fluid is simultaneously displaced and drained from the bottom of the reaction chamber at a controlled rate. After the electronic component precursors are exposed to the drying fluid and dried, they can be removed from the reaction chambers.

When the methods of the invention are performed using a wet bench, the electronic component precursors may be moved to a different reaction chamber which contains a drying fluid or the electronic component precursors may be lifted from the last reaction chamber and covered with drying fluid until the reactive chemical process fluid is removed and the electronic component precursors are dried.

Using the methods of the present invention, the electronic component precursors will be treated with any number of process fluids.

For example, the electronic component precursors may be treated with three process fluids, wherein the first process fluid is a solution of water, hydrogen peroxide, and ammonium hydroxide (80:3:1); the second process fluid is a solution of water, hydrogen peroxide, and hydrochloric acid (80:1:1); and the third process fluid is hydrofluoric acid (about 10:1 to about 1000:1 (Water:HF)). This sequence may also be reversed. This method is particularly useful for cleaning and etching (i.e., removing oxide from the wafer surface).

In other embodiments of the invention, the electronic component precursors may be treated with a solution of sulfuric acid saturated with ozone, and then with a solution of HF. This method is particularly useful for removing organic and some particulate, while leaving a hydrophobic surface. The sulfuric acid concentration is approximately 98% by weight with as much ozone as can be generated (i.e., 1.74 g/min.). The HF concentration range is about 10:1 to about 1000:1 (Water:HF).

In other embodiments of the invention, the electronic component precursors may be treated with a further series of process fluids, such as a solution of sulfuric acid saturated with ozone; followed by a solution of hydrogen peroxide and ammonium hydroxide; and then a solution of hydrogen peroxide, hydrochloric acid, and water. This method is particularly useful for the removal of organic as well as general cleaning (i.e., particle removal with minimal metal deposition) leaving a hydrophilic surface. The concentrations set forth above are applicable here.

Notwithstanding the various process fluids that may be used to treat electronic component precursors, the final reactive process fluid is generally HF to provide a bare silicon surface which is then available for further treatment. It is preferred that the final treatment of the electronic component precursors with the HF be done in two steps. In the first step, the electronic component precursors are treated with a 200:1 (water:HF) solution of HF. In the second step, the wafers are treated with a 400:1 (water:HF) solution of HF. By using this two step process, buildup of HF on the surface of the electronic component precursors is avoided and there is not an extreme change in chemical concentrations such that problems of leaching, spotting, or precipitation are avoided.

The methods of the invention are particularly suited for the treatment of electronic component precursors having a hydrophobic surface, such as pre-epi wafers.

What is claimed is:

1. A method for the manufacture of electronic component precursors having surfaces comprising:

a) placing the electronic component precursors in a reaction chamber;

b) contacting the surfaces of said electronic component precursors with a final reactive chemical process fluid for a period of time; and c) subsequently, exposing the electronic component precursors of step b) to a drying fluid for a period of time, after the electronic component precursors have been exposed to the final reactive chemical process fluid and without contacting the electronic component precursors with a final rinsing fluid in between the step of contacting the precursors with the final reactive chemical process fluid and the step of exposing the precursors to the drying fluid.

2. The method of claim 1 wherein the drying fluid is selected from the group consisting of isopropanol and diluted isopropanol.

3. The method of claim 2 wherein the drying fluid is isopropanol diluted with nitrogen.

4. The method of claim 1 wherein the drying fluid is a vapor.

5. The method of claim 4 wherein the vapor is selected from the group consisting of isopropanol and diluted isopropanol.

6. The method of claim 5 wherein the vapor is isopropanol diluted with nitrogen.

7. The method of claim 1 wherein the reactive chemical process fluids are selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

8. The method of claim 7 wherein the reactive chemical process fluid is hydrochloric acid.

9. The method of claim 7 wherein the reactive chemical process fluid is hydrogen peroxide.

10. The method of claim 7 wherein the reactive chemical process fluid is hydrofluoric acid.

11. The method of claim 7 wherein the reactive chemical process fluid is a hydrofluoric acid buffer.

12. The method of claim 7 wherein the reactive chemical process fluid is a hydrofluoric and nitric acid buffer.

13. The method of claim 1 wherein the reaction chamber is a full-flow vessel.

14. The method of claim 1 wherein the reaction chamber is an enclosed vessel.

15. A method for the manufacture of electronic component precursors having surfaces comprising:
   a) placing the electronic component precursors in a reaction chamber;
   b) contacting the surfaces of said electronic component precursors with a first reactive chemical process fluid for a period of time;
   c) exposing the electronic component precursors of step b) to a drying fluid for a period of time immediately following the contacting with the first reactive chemical process fluid, without contacting the electronic component precursors with a rinsing fluid following the contacting with the first reactive chemical process fluid; and
   d) subsequently, contacting the dried electronic component precursors of step c) with a second reactive chemical process fluid.

16. The method of claim 15 wherein the drying fluid is selected from the group consisting of isopropanol and diluted isopropanol.

17. The method of claim 16 wherein the drying fluid is isopropanol diluted with nitrogen.

18. The method of claim 15 wherein the drying fluid is a vapor.

19. The method of claim 18 wherein the vapor is selected from the group consisting of isopropanol and diluted isopropanol.

20. The method of claim 19 wherein the vapor is isopropanol diluted with nitrogen.

21. The method of claim 15 wherein the reactive chemical process fluids are selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

22. The method of claim 15 wherein the reaction-chamber is a full-flow vessel.

23. The method of claim 15 wherein the reaction chamber is an enclosed vessel.

24. A method for the manufacture of electronic component precursors comprising:
   a) placing the electronic component precursors in a reaction chamber;
   b) contacting the surfaces of said electronic component precursors with an aqueous solution of ammonium hydroxide and hydrogen peroxide for a period of time;
   c) exposing the electronic component precursors of step b) to a drying fluid for a period of time;
   d) contacting said electronic component precursors of step c) with an aqueous solution of hydrochloric acid and hydrogen peroxide for a period of time;
   e) exposing said electronic component precursors of step d) to a drying fluid for a period of time, without contacting the electronic component precursors with a rinsing fluid;
   f) contacting said electronic component precursors of step e) with an aqueous solution of hydrofluoric acid for a period of time; and
   g) drying said electronic component precursors of step f).

25. The method of claim 24 wherein said drying comprises the step of treating said electronic component precursors with a drying fluid.

26. The method of claim 25 wherein the drying fluid is selected from the group consisting of isopropanol and diluted isopropanol.

27. The method of claim 24 wherein the drying fluid is selected from the group consisting of isopropanol and diluted isopropanol.

28. The method of claim 24 wherein the drying fluid is a vapor.

29. The method of claim 24 wherein the vapor is selected from the group consisting of isopropanol and diluted isopropanol.

30. The method of claim 24 wherein the drying fluid is isopropanol diluted with nitrogen.

31. The method of claim 24 wherein the reaction chamber is a full-flow vessel.

32. The method of claim 24 wherein the reaction chamber is an enclosed vessel.

33. A method for the manufacture of electronic component precursors having surfaces, comprising:
   a) placing the electronic component precursors in a reaction chamber;
   b) contacting the surfaces of said electronic component precursors with a final reactive chemical process fluid for a period of time; and
   c) exposing the electronic component precursors of step b) to a drying fluid for a period of time, after the electronic component precursors have been exposed to the final reactive chemical process fluid, whereby the drying fluid displaces the final reactive chemical process fluid from the surfaces of the electronic component precursors.

34. The method of claim 33 wherein the drying fluid directly displaces the reactive chemical process fluid from the surfaces of the electronic component precursors.

35. The method of claim 34 wherein the drying fluid directly displaces the reactive chemical process fluid from the surfaces of the electronic component precursors at a rate such that substantially no reactive chemical process fluid remains on the surfaces of the electronic component precursors.

36. The method of claim 34 wherein the drying fluid directly displaces the reactive chemical process fluid from the surfaces of the electronic component precursors at a rate such that substantially no liquid droplets remain on the surfaces of the electronic component precursors.

37. The method of claim 33 wherein the drying fluid displaces the reactive chemical process fluid from the surfaces of the electronic component precursors at a rate such that substantially no reactive chemical process fluid remains on the surfaces of the electronic component precursors.

38. The method of claim 33 wherein the drying fluid displaces the reactive chemical process fluid from the surfaces of the electronic component precursors at a rate such that substantially no liquid droplets remain on the surfaces of the electronic component precursors.

39. The method of claim 33 wherein the drying fluid is a vapor.

40. The method of claim 39 wherein the vapor is selected from the group consisting of isopropanol and diluted isopropanol.

41. The method of claim 40 wherein the vapor is isopropanol diluted with nitrogen.

42. The method of claim 33 wherein the reactive chemical process fluid is selected from the group consisting of aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, and combinations thereof.

* * * * *